United States Patent [19]

Mao

[11] Patent Number: 4,594,577
[45] Date of Patent: Jun. 10, 1986

[54] CURRENT MIRROR DIGITAL TO ANALOG CONVERTER

[75] Inventor: Roger A. Mao, Cupertino, Calif.

[73] Assignee: American Microsystems, Inc., Santa Clara, Calif.

[21] Appl. No.: 650,120

[22] Filed: Sep. 24, 1982

Related U.S. Application Data

[62] Division of Ser. No. 183,171, Sep. 2, 1980, Pat. No. 4,384,274, which is a division of Ser. No. 50,961, Jun. 22, 1979, abandoned.

[51] Int. Cl.$^4$ .......................................... H03K 13/03
[52] U.S. Cl. ........................ 340/347 DA; 340/347 M; 375/30
[58] Field of Search ... 340/347 DA, 347 M, 347 AD, 340/347 CC; 375/30

[56] References Cited

U.S. PATENT DOCUMENTS

| | | | |
|---|---|---|---|
| 3,579,227 | 5/1971 | Appelgren | 340/347 DA |
| 4,045,793 | 8/1977 | Moench | 340/347 DA |
| 4,311,988 | 1/1982 | Kelley et al. | 340/347 DA |
| 4,408,190 | 10/1983 | Nagano | 340/347 DA |

OTHER PUBLICATIONS

"Electronic Analog/Digital Conversions", by Hermann Schmid, General Electric Company, USPTO Library (7/6/71), pp. 8–11.

"Analog-Digital Conversion Handbook", by The Engineering Staff of Analog Devices, Inc., Edited by Daniel H. Sheingold, Jun. 1972, pp. 11-56 thru 11-59.

Primary Examiner—T. J. Sloyan
Attorney, Agent, or Firm—Steven F. Caserza; Alan H. MacPherson; Eppa Hite

[57] ABSTRACT

An integrated circuit digital to analog converter comprised of MOS current mirrors and utilizing additional MOS devices to provide transmission gates and control means. Each transmission gate 36 is connected to a source of digital data to be converted and the mirroring device for each transmission gate 36 has a channel width with some predetermined proportional relationship to the channels of input transistors 12 and mirroring output MOS transistors 14 to 44 with the input transistor 12 connected to a constant current source, the total output mirroring current of the output mirroring transistors is in quantised analog form and varies according to the cumulative currents from the mirroring MOS transistors as the transistors are activated. The invention may be embodied in linear multiplying, non-linear and companding converters.

4 Claims, 15 Drawing Figures

FIG_1  FIG_1A

FIG_2-1  FIG_2-2

FIG_2A-1  FIG_2A-2

FIG_3

FIG_4

FIG_5

FIG-8 ions and distance of the aforesaid problems and disadvantages.

CURRENT MIRROR DIGITAL TO ANALOG CONVERTER

This application is a division of application Ser. No. 183,171, filed Sept. 2, 1980, U.S. Pat. No. 4,384,274, which in turn is a division of application Ser. No. 050,961 filed June 22, 1979, abandoned.

This invention relates to electronic devices for converting digital data to an analog output and more particularly to such a device that may be implemented as a monolithically fabricated MOS-type integrated circuit device.

Digital-to-analog and analog-to-digital converters are required for many types of electronic apparatus, in fact, wherever it is necessary to interface analog data with digital operation and vice versa. In the transmission of voice information by telephone, it is desirable to convert the analog voice signal to a digital format in order to substantially reduce the effects of noise and signal distortion normally introduced. In other words, a digital signal consisting of zero and one levels is easier to reconstruct or amplify faithfully than an analog signal comprised of a large number of levels. Thus, particular need for efficient digital-to-analog converters arose with pulse code modulated (PCM) telephone systems.

In such communication systems, an encoder-decoder (codec) is used. In the encoder section, analog voice input is converted into digital data for transmission over a telephone line, and in the decoder section a digital-to-analog conversion must be provided to restore the sound of the voice after transmission.

Heretofore, these conversions were accomplished with high speed a-d and d-a converters multiplexed over many analog channels. Using large-scale integration techniques each channel was encoded separately and the resulting digital signals were multiplexed.

With efforts to provide a codec system in the form of one or more integrated circuit semiconductor devices, a problem arose of providing a suitable A to D and D to A converter in a more efficient semiconductor form. One approach to the problem has been to use the so-called capacitor ladder circuit which depends basically on the voltage division of the ladder itself. In such a device, a series of binary-type capacitors are provided with one plate in common and bottom plates of different sizes and thus having different assigned values. When voltages are applied to the bottom plates of the capacitors, then on the top plate of the array itself, a voltage is produced which is a binary sum of all capacitive weighted voltages on the bottom plate. Thus, in a D to A converter a series of digital voltages applied to the bottom plates of the capacitor ladder produces an analog output on the top plates. The accuracy of the output depends in part on the number of capacitors.

One problem in fabricating such a capacitive ladder converter in semiconductor form was the complications inherent in developing a special process with a minimum of extra method steps for producing the capacitors with the necessary electrical characteristics and accuracy tolerances. Another disadvantage with the capacitive ladder technique was that it required the use of a buffering amplifier for most applications. This further complicated the circuitry and process steps required.

The present invention provides a digital to analog converter utilizing only MOSFET elements in an integrated circuit device which does not rely on capacitor ladders or arrays and thus avoids the aforesaid problems and disadvantages.

BRIEF SUMMARY OF THE INVENTION

In accordance with the principles of the present invention, a digital-to-analog converter is provided which utilizes controlled MOS current mirrors. In such a mirror the ratio of the saturated drain current of two connected MOS transistors is proportional to the widths of their channels assuming their surface mobilities, oxide thicknesses, channel lengths, device thresholds and gate voltages are identical in value. The output current is produced by the mirroring MOS transistor. In the connection between the two MOS devices a transmission gate in combination with another switching device provides on-off control of the mirrored current output. In a typical converter, the mirroring MOS transistors controlled by the transmission gates with their control devices are connected in parallel. Each transmission gate is connected to a source of digital data such as a microprocessor and the mirroring device for each transmission gate has a channel width with some predetermined proportional relationship to the channel widths of the input and mirroring output transistor. Thus, with the input transistor connected to a constant current source $I_1$ the total output mirroring current $I_2$ of the output mirroring transistors in analog form, varies according to the mirrored current contributions from the mirroring MOS transistors in a quantising process as they are activated. The aforesaid principles of the invention may be applied to implement linear, multiplying and companding converters fabricated as either P-channel, N-channel or complementary MOS structures.

In summary, the objects of the present invention are: to provide a digital-to-analog converter utilizing MOS devices and therefore capable of being fabricated using conventional or known MOS process techniques; to provide a digital-to-analog converter in a monolithic integrated circuit form with a minimum of chip area; and to provide a D/A converter that can be implemented in various forms to accommodate different electronic apparatus.

Other objects, advantages and features of the present invention will become apparent from the following detailed description thereof, presented in conjunction with the accompanying drawing.

BRIEF DESCRIPTION OF THE DRAWING

FIG. 2-1 is a circuit diagram of a controlled N-channel MOS current mirror;

FIG. 2-2 is the circuit of FIG. 2-1 using a logic symbol for the control gate elements with a current mirror;

FIG. 2A-1 is a circuit diagram of controlled P-channel MOS current mirror;

FIG. 2A-2 is the circuit of FIG. 2A-1 using a logic symbol for the control gate elements with a current mirror;

DETAILED DESCRIPTION OF THE EMBODIMENTS

Figure 1:
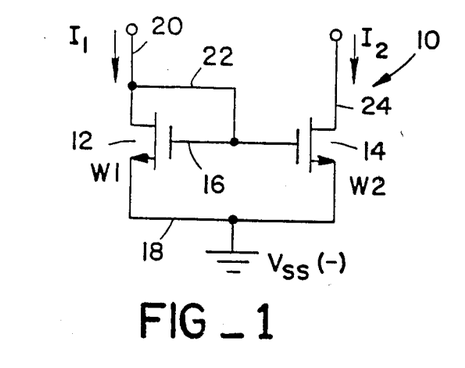
FIG. 1 is a circuit diagram of an N-channel MOS current mirror.
Figure 1A:
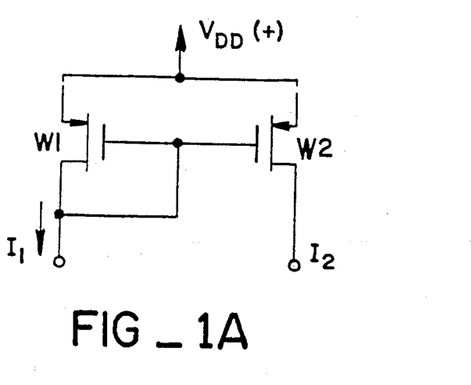
FIG. 1A is a circuit diagram of a P-channel MOS current mirror.

With reference to the drawings, FIGS. 1 and 1A show diagrammatically a basic form of current mirror 10 using MOSFET elements. In the N-channel MOS version of FIG. 1, a pair of MOSFET's 12 and 14 are provided whose gates are connected by a common lead 16 and whose source contacts are connected to a common ground 18. The drain connected lead 20 of one element is connected by a lead 22 to the common gate lead 16 so that the voltage applied to the gates of both MOSFET's is equal.

The ratio of the saturated drain currents of the two elements in the mirror may be expressed as follows:

$$\frac{I_2}{I_1} = \frac{(\mu_2 \epsilon_{ox} W_2/2T_{ox2}L_2)(V_{G2} - V_{T2})^2}{(\mu_1 \epsilon_{ox} W_1/2T_{ox1}L_1)(V_{G1} - V_{T1})^2} \quad \text{(Equation 1)}$$

Assuming that the surface mobilities ($\mu$'s), oxide thicknesses ($T_{ox}$'s), channel length (L's), and device thresholds ($V_T$'s) are equal, and noting that the gate voltages ($V_G$'s) of the two MOSFET's 12 and 14 are electrically identical in value, the equation reduces to:

$$I_2 = \frac{W_2}{W_1} I_1 \quad \text{(Equation 2)}$$

where $W_2$ and $W_1$ are the channel widths of the MOSFET's 12 and 14.

This relation shows that ideally the mirroring current $I_2$ in the drain connected lead 24 for MOSFET 14 is a function of both input current $I_1$ and the device channel widths. In the "real world" some of the parameters of Equation 1 will vary to some degree depending on variations in processing and layout procedures and electrical parameters. However, such variations can be kept to a minimum by design and production controls, so essentially the relationship of Equation 2 is valid without introducing compensating factors. This also holds true for the P-channel MOS version of the current mirror circuit, as shown in FIG. 1A, wherein the source of each transistor is connected to a common positive power supply ($V_{DD}$).

Figure 21:
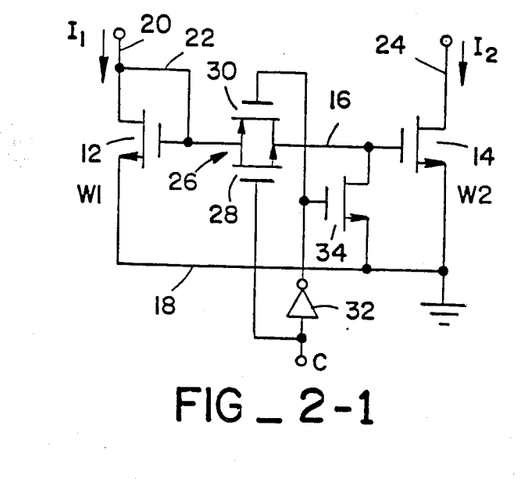

The current mirror as shown in FIGS. 1 and 1A is not easily controlled, so to solve this problem, as shown in FIG. 2-1, the common lead 16 between the two current elements 12 and 14 is broken and a transmission gate 26 comprising an additional pair of MOSFET elements 28 and 30 is inserted. One MOSFET element 28 has its gate connected to a control voltage C, its drain connected to the $I_1$ side of lead 16 and its source to the $I_2$ side of lead 16. The other gate element 30 has a gate connected to an inverted control voltage $\overline{C}$ which is supplied by applying the control voltage C through an inverter 32. The source of MOSFET element 14 is connected to the $I_1$ current lead 18 and its drain is connected to the $I_2$ current lead 24. To prevent the gate of output element 14 from floating when the gate elements 28 and 30 are off, another MOSFET device 34 is provided having its drain connected to the common lead 16, its source connected to ground and its gate connected to the inverted control voltage (in the N-channel MOS version of FIG. 2-1). The element 34 is essentially a pull-down transistor, which when activated pulls down the gate of the mirroring element 14 and therefore turns it off. In some instances, device 30 need not be used.

Thus, when a signal (e.g. a logic 1) is applied to the transmission gate 26 the gate is "on" and the pull-down transistor 34 is "off," so that the mirror voltage is applied to the second or mirroring transistor 14 from the first transistor 12. Conversely, if the control signal "C" is low or a logic "0," then the transmission gate transistor 28 is "off" and the pulldown transistor 34 is "on." This turns off the mirroring transistor 14. Thus, an on-off control of current $I_2$ is implemented which may be represented as:

$$I_2 = \frac{W_2}{W_1} CI_1 \quad \text{(Equation 3)}$$

where "C" is the control bit (zero or one).

Figure 22:
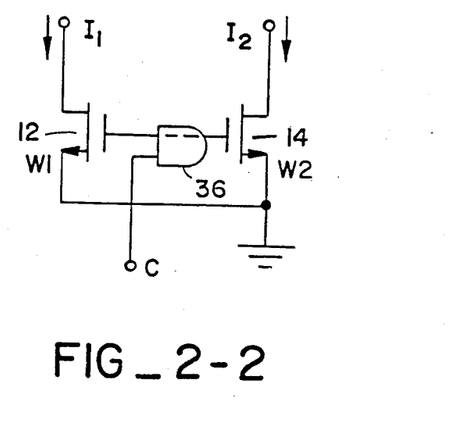

FIG. 2-2 is a representation of the circuit of FIG. 2-1 using a logic AND gate 36 to symbolize the transmission gate 26 and pulldown transistor 34, and hereafter called a control gate.

Figure 2A:
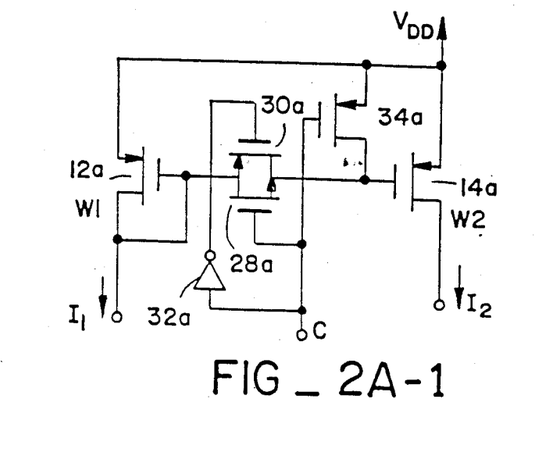
Figure 2A:
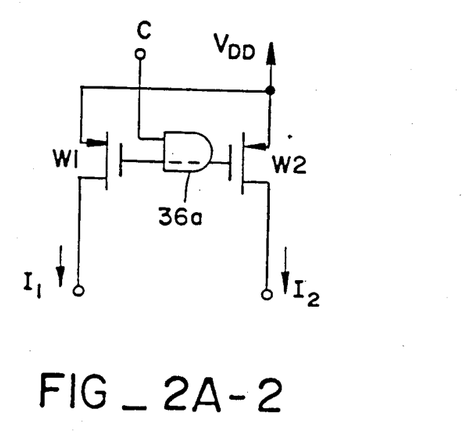

In FIG. 2A-1 is shown a P-channel MOS implementation of the basic mirror circuit with the same control elements as in the N-channel MOS version of FIG. 2-1. Here, the control input C is applied to the gate of pullup transistor 34a. The sources of MOS devices 12a and 14a are connected to a positive power source ($V_{DD}$) while the drain of transistor 12a is connected to a current source $I_1$ and the drain of transistor 14a provides the current weighted output of the circuit. The diagram using a logic symbol for the transmission gate and its control device and designated by the numeral 36a is shown in FIG. 2A-2.

Figure 3:
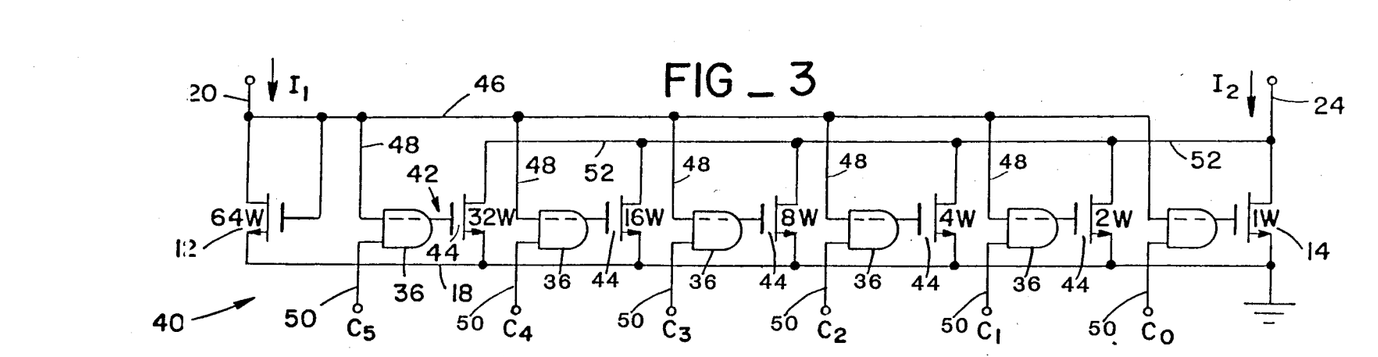
FIG. 3 is a circuit diagram of a six-bit N-channel linear current mirror digital-to-analog converter embodying principles of the present invention.

FIG. 3 shows a six-bit N-channel linear current mirror digital-to-analog converter 40 comprising a series of parallel connected mirror cells 42 each of which is similar to the mirror cell of FIG. 2-2. Each cell is comprised of a control gate 36 and a mirroring transistor 44. The channel width of each mirroring transistor in this converter is carefully proportioned and in normal application is one-half the channel width of the mirroring transistor for the next adjacent cell toward the input transistor 12. Thus, the converter 40 comprises an input lead 20 connected to a power source producing a constant current $I_1$ and to the drain of the first or input transistor 12 whose source terminal is connected to a common ground lead 18. The input lead 20 is also connected to a common branch lead 46 to which each of the other control gates 36 is connected by a lead 48. Each of these transmission gates has another input lead 50 which is connected to a control voltage source, e.g., $C_0$, $C_1$, $C_2$, $C_3$, $C_4$ and $C_5$. The output of each control gate 36 is connected to the gate electrode of one of the mirroring transistors 44 whose source terminals are connected to the ground line 18 and whose drain terminals are connected to a common line 52 connected to output line 24. In this converter 40, the first mirroring transistor has a channel of unit width 1W, the adjacent transistor has a channel width of 2W. The next mirroring transistor has a channel width of 4W. The next mirroring transistor has a channel width of 8W, the next, a width of 16W, and the next transistor has a channel width of 32W, with the input transistor 12 connected directly to the $I_1$ power source having a channel width of 64W.

Thus, for the converter 40 of FIG. 3, the output current $I_2$ may be represented mathematically as follows:

(Equation 4)
$$I_2 = \left( \frac{32}{64} c_5 + \frac{16}{64} c_4 + \frac{8}{64} c_3 + \frac{4}{64} c_2 + \frac{2}{64} c_1 + \frac{1}{64} c_0 \right) I_1$$

In the operation of the digital-to-analog converter 40, the lead 20 is connected to the reference power source that produces a constant current $I_1$, and the $I_2$ output lead 24 is connected to whatever device is adapted to receive the developed analog signal output. The control or data inputs $C_0$ to $C_5$ are connected to a six bit data input from the digital source that is to be converted. When all data inputs are zero, no current will flow in the output lead 24 because all of the transmission gates in control gates 36 are off and their respective pulldown transistors are on, thereby keeping each mirroring transistor 44 off. If one digital input is high or logic 1, for example, if the $C_0$ input is high and all other inputs are low, then $I_2$ will equal 1/64th of the current of $I_1$ because the ratio of the channel widths of these two devices is 1 to 64 and the device receiving the input $C_0$ will mirror the $I_1$ current of the input device in proportion to the input and mirroring device channel widths. Now, if input $C_0$ is turned off (becomes zero) and $C_1$ is turned on, the device will again mirror the $I_1$ current, but this time in the ratio of 2 to 64. This binary relationship also applies if different input combinations of $C_0$ to $C_5$ are selected, and the output current $I_2$ will vary accordingly. In a typical application, the data inputs $C_0$ to $C_5$ may be connected to a microprocessor or the like that supplies digital data in bit groups or in a clocked data stream. Depending on the resolution desired, any number of bit inputs (i.e., six or other than six) can be applied up to practical limits, and of course the resolution of the analog output increases with the number of control inputs provided. Also, a D/A converter, as just described, could be fabricated in either the N-channel MOS arrangement, as illustrated, or in P-channel, using either conventional planar or V-MOS design rules and processing techniques.

Figure 4:
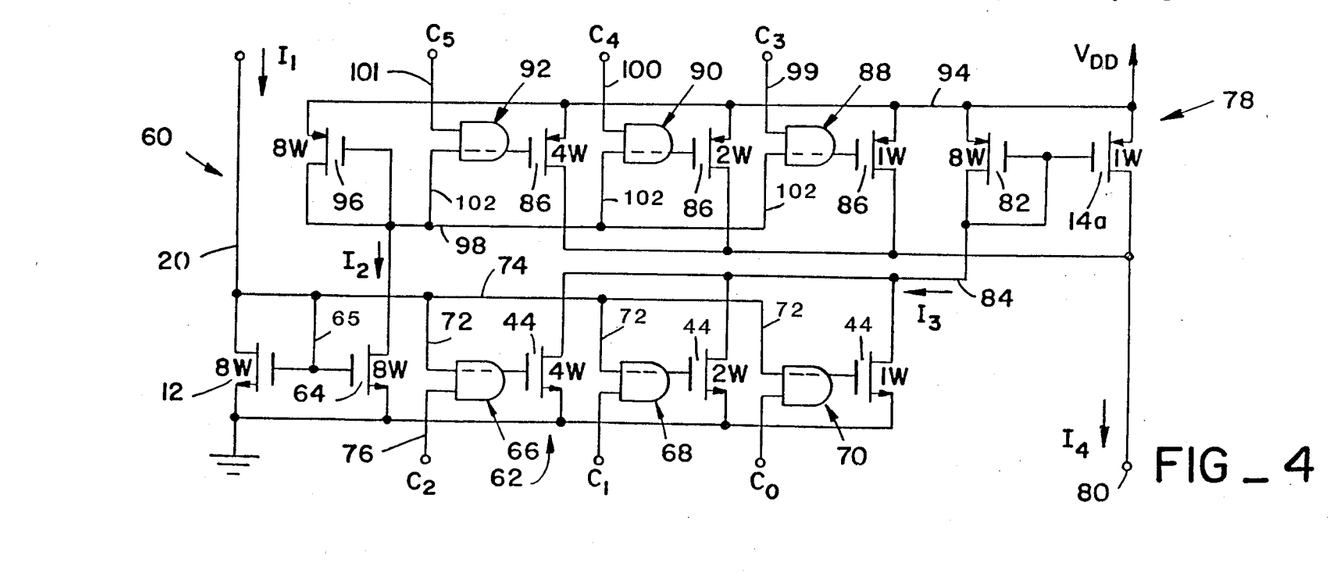
FIG. 4 is a circuit diagram of a six-bit CMOS linear current mirror digital-to-analog converter according to the invention.

A modified form of the invention, as shown in FIG. 4, is exemplified by a six-bit complementary MOS (CMOS) linear current mirror digital-to-analog converter 60. Here, the constant current ($I_1$) input is connected by a lead 20 to the drain of a first input transistor 12 whose source is connected to ground in the N-channel section 62 of the converter. The gate of the input transistor 12 is connected to the gate of a non-controlled current mirroring transistor 64 of the same size, and the gates of these two transistors are connected to the constant current ($I_1$) source via a lead 65. Also connected to transistors 12 and 64 are three control gate elements 66, 68 and 70, all similar to the elements shown in FIG. 2-2, each comprising a transmission gate with its output attached to the gate of a mirroring transistor 44. One input 72 to each control gate is connected to the $I_1$ input lead 20 via a common lead 74 and its other input 76 is connected to a digital data input $C_0$, $C_1$ and $C_2$. Each of the mirroring transistors 44 has a channel width that has some predetermined size ratio with the input transistor 12. Thus, the first transmission gate having a data input "$C_0$" has a control transistor with a channel width of "1W." The adjacent or second transmission gate having a data input "$C_1$" has a control transistor with a channel width of 2W, and the third transmission gate, having a digital input of "$C_2$" has a control transistor with a channel width of "4W."

In an upper P-channel section 78 of the converter 60, a mirroring transistor 14a has its source connected to a constant voltage source ($V_{DD}$), its drain being connected to the analog output terminal 80. A second transistor 82, whose gate is connected to the gate of transistor 14a, also has its source connected to the $V_{DD}$ line, but its channel width is a predetermined size greater (e.g. 8W) than the channel width of transistor 14a. The gates of transistors 14a and 82 are connected to the drain of transistor 82 and, via a lead 84 to the drains of the three control transistors 44 for the gate elements 66, 68 and 70 in the N-channel section. Now, in common with the drain of transistor 14a are the drains of three mirroring transistors 86 with their associated gate elements 88, 90 and 92 all connected in essentially the same manner as shown in FIG. 2A-1. A sixth transistor 96 in the P-channel section, having a channel width of 8W, is also source connected to the $V_{DD}$ line 94, and its drain is connected to a lead 98 connected in common with input leads 102 to all three of the P-channel transmission gates. Again, each mirroring transistor 86 for each control gate element has a channel width which is sized in a predetermined proportion to the transistor 96, and the source of each control transistor is connected to a common $V_{DD}$ line 94. Thus, the channel widths for the mirroring transistors of control gate elements 88, 90 and 92 are 1W, 2W and 4W, as indicated on the drawing. To each of the P-channel control gates 88, 90 and 92 is furnished another input which comes from the digital data source. Thus, gate element 88 receives an input $C_3$ through lead 99, gate element 90 receives an input $C_4$ through lead 100, and gate element 92 receives an input $C_5$ through lead 101.

For the converter 60, the value of the output current $I_4$ may be derived as follows:

(Equation 5)
$$I_4 = \left( \frac{4}{8} c_5 + \frac{2}{8} c_4 + \frac{1}{8} c_3 \right) I_2 + \frac{1}{8} I_3; \text{ BUT}$$

$$I_3 = \left( \frac{4}{8} c_2 + \frac{2}{8} c_1 + \frac{1}{8} c_0 \right) I_1$$

$$I_4 = \left( \frac{4}{8} c_5 + \frac{2}{8} c_4 + \frac{1}{8} c_3 \right) I_1 + \frac{1}{8} \left( \frac{4}{8} c_2 + \frac{2}{8} c_1 + \right.$$

-continued $$\frac{1}{8} c_0 \Bigg) I_1; \text{ or } \Bigg( \text{MULT the first term by } \frac{8}{8} \Bigg)$$

$$I_4 = \Bigg( \frac{32}{64} c_5 + \frac{16}{64} c_4 + \frac{8}{64} c_3 +$$

$$\frac{4}{64} c_2 + \frac{2}{64} c_1 + \frac{1}{64} c_0 \Bigg) I_1$$

In operation the converter 60 provides its digital-to-analog function as follows: Assuming that all the digital data bits $C_1$ to $C_5$ are at logic zero except $C_0$, the circuit on its left end, as shown in FIG. 4, is a strict current mirror without any control and generates a current $I_2$ from the constant current input $I_1$. In the example shown, $I_2$ should be equal to $I_1$ because the ratio of the transistor 12 and its mirroring transistor 64 is 8W compared to 8W. The $I_2$ current is fed into the upper current mirror section 78, but since the bits $C_3$, $C_4$ and $C_5$ are low or zero, the upper mirroring devices are turned off. Since $C_1$ and $C_2$ are also zero, these devices are off and there is a current $I_3$ which is generated strictly by $C_0$. Since the control transistor for the transmission gate 70 has a channel width of 1W, the value of $I_3$ is $\frac{1}{8}$ of $I_1$. Now, $I_3$ is fed to the transistor 82 in the upper or P-channel mirror section 78 via lead 84 where it is broken up into a finer resolution. Since the transistor 82 has a channel width of 8W and its mirroring transistor 14a has a width of 1W, the output current $I_4$ is reduced proportionately, i.e. $\frac{1}{8} \times \frac{1}{8} = 1/64$ the value of $I_1$.

In another example, if $C_0$ were turned off and $C_1$ were high or logic one, then $I_3$ would be 2/8 or $\frac{1}{4}$ the value of $I_1$ and in the second or P-channel mirror section, the value of the output current $I_4$ would become $\frac{1}{8} \times 2/8$ or 2/64 the value of the input current $I_1$. If $C_0$, $C_1$ and $C_2$ are all assumed to be low and $C_5$ is a logic one, the lower or N-channel mirror section of converter 60 produces a current $I_2$ which enters transistor 96 and which is mirrored by the transistor 86 having a channel width of 4W and producing a current 4/8 of $I_2$. By simple summation, $I_4$ would be 4/8 of $I_1$. Thus, as described, the circuit of FIG. 4 provides a linear type of current steering ladder.

Figure 5:
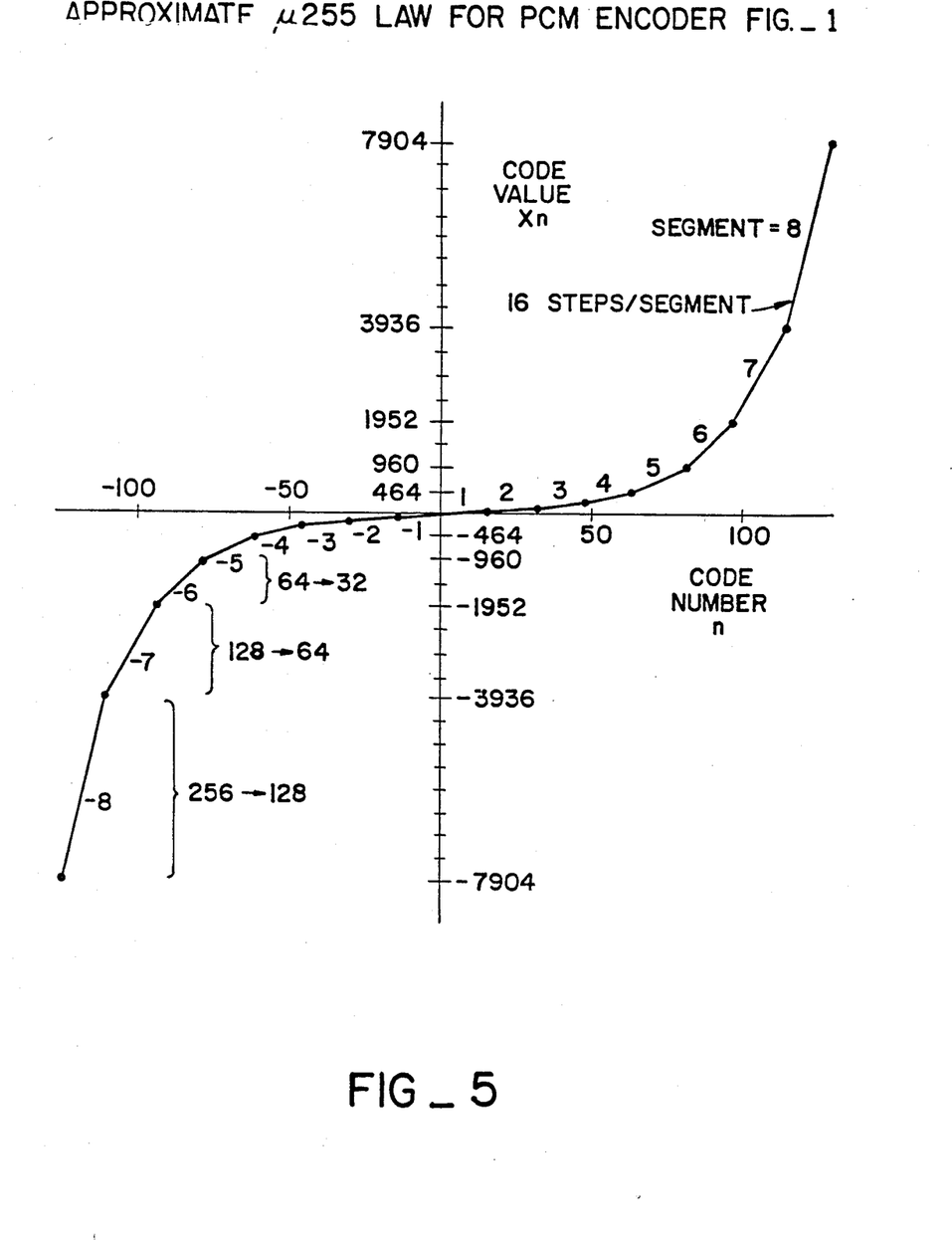
FIG. 5 is a graphical representation of the "μ255 law" for a digital encoder.

Because the human voice covers a wide range of sound intensities, it was found that in order to minimize the number of digital bits required for voice transmission and still satisfy the aesthetics of human hearing, a logarithmic analog to digital conversion was required. One form of logarithmic curve used is commonly referred to as the "$\mu 255$ law" curve and is based on 8 bit Pulse Code Modulation (PCM). The code is similar to scientific notation in that it consists of a sign bit, four bits for the mantissa, and three bits for the exponent. In terms of the logarithmic (companding and de-companding) curves, the sign bit determines the quadrant of operation, the three bits the chord or segment within the quadrant, and the four bits the step within the chord. The number of bits predetermines the number of level subdivisions (code numbers) of the expression $2^n$. Thus, there are two quadrants, 8 chords per quadrant, and 16 steps per chord. The $\mu 255$ law is specified by documents available from the International Telegraph and Telephone Consultative Committee (CCITT) (Europe) and by the American Telephone and Telegraph Company (AT&T) (USA). FIG. 5 shows an approximate version of the law composed of two quadrants and segments within the quadrants for a digital-to-analog converter used in conjunction with the encoder (transmitter). The circuit constructed in accordance with one embodiment of this invention provides approximately the same properties as the $\mu 255$ law in that the range of each increasing segment is twice the range of the previous segment. The only difference is that the first step in the first segment uses the value 2 rather than the specified value 1. This leads to a small shift in the law, and to the simplification that each segment can be represented by half the specified range value (i.e., the range 256 becomes 128). This simplification will help in understanding the algorithm required to develop the current mirror circuit required to implement the law. Since the endpoints are eventually normalized, there is no loss of generality. The following Table 1 provides the algorithm required to construct the circuit:

TABLE 1

APPROXIMATE $\mu 255$ LAW FOR PCM ENCODER (ALGORITHM)

| Segment Number | Code Number Range (n) | Segment Range Values (Extreme Values) ($v_n$) |
|---|---|---|
| −8 | −127 to −112 | 0 + 0 + 128 (1 to 16) = 128 to 2048 |
| −7 | −111 to −96 | 0 + 128(16) + 64 (1 to 16) = 2112 to 3072 |
| −6 | −95 to −80 | 2048 + 64(16) + 32 (1 to 16) = 3104 to 3584 |
| −5 | −79 to −64 | 3072 + 32(16) + 16 (1 to 16) = 3600 to 3840 |
| −4 | −63 to −48 | 3584 + 16(16) + 8 (1 to 16) = 3848 to 3968 |
| −3 | −47 to −32 | 3840 + 8(16) + 4 (1 to 16) = 3972 to 4032 |
| −2 | −31 to −16 | 3968 + 4(16) + 2 (1 to 16) = 4034 to 4064 |
| −1 | −15 to 0 | 4032 + 2(16) + 1 (1 to 16) = 4065 to 4080 |
| 1 | 0 to 15 | (4064 + 1(16)) + 1 (0 to 15) = 4080 to 4095 |
| 2 | 16 to 31 | 4080 + 1(16) + 2 (0 to 15) = 4096 to 4126 |
| 3 | 32 to 47 | 4096 + 2(16) + 4 (0 to 15) = 4128 to 4188 |
| 4 | 48 to 63 | 4128 + 4(16) + 8 (0 to 15) = 4192 to 4312 |
| 5 | 64 to 79 | 4192 + 8(16) + 16 (0 to 15) = 4320 to 4560 |
| 6 | 80 to 95 | 4320 + 16(16) + 32 (0 to 15) = 4576 to 5056 |
| 7 | 96 to 111 | 4576 + 32(16) + 64 (0 to 15) = 5088 to 6048 |
| 8 | 112 to 127 | 5088 + 64(16) + 128 (0 to 15) = 6112 to 8032 |

Since current mirrors have current flow in one direction the algorithm proceeds, for example, from the lower left hand corner of the graph of FIG. 5 (negative quadrant) to the upper right hand corner of the graph (positive quadrant). When the current is eventually converted to a voltage, the current flowing at the center point of the graph can be referenced to a ground potential associated with a plus and minus supply system (i.e. $V_{DD} = +5$ V, $V_{SS} = -5$ V, and $V_{GND} = 0$ V). The first segment (−8) encountered has a range of 128, and since each segment consists of 16 steps, the law proceeds through each step providing values whose endpoints or extreme points are shown. The second segment (−7) encountered has a range of 64. The term 128(16) is the end value of the previous segment, and is required since the law is built from the sum of each previous segment encountered. The next segment (−6) encountered consists of the steps weighted by 32, the value of the previous segment 64(16), and the sum of all other previous segments before that. The algorithm proceeds through each segment in a similar manner. From the algorithm an equation is developed as shown in the following Table 2.

TABLE 2
APPROXIMATE μ255 LAW FOR PCM ENCODER (EQUATION)

$$I_{OUT} = \left[ \frac{255}{255} C\pm I_1 + \frac{128}{255} (C_7'I_1 + C_7I_2) + \frac{64}{255} (C_6'I_1 + C_6I_2) + \frac{32}{255} (C_5'I_1 + C_5I_2) + \frac{16}{255} (C_4'I_1 + C_4I_2) + \frac{8}{255} (C_3'I_1 + C_3I_2) + \frac{4}{255} (C_2'I_1 + C_2I_2) + \frac{2}{255} (C_1'I_1 + C_1I_2) + \frac{1}{255} (C_0'I_1 + C_0I_2) \right];$$

$$I_1 = \frac{16}{32} I_R;$$

$$I_2 = \frac{8}{32} S_3 I_R + \frac{4}{32} S_2 I_R + \frac{2}{32} S_1 I_R + \frac{1}{32} S_0 I_R + \frac{1}{32} \overline{C\pm} I_R \text{ or}$$

TABLE 2-continued
APPROXIMATE μ255 LAW FOR PCM ENCODER (EQUATION)

$$I_2 = \frac{1}{32} (8S_3 + 4S_2 + 2S_1 + 1S_0 + 1\overline{C\pm}) I_R$$

$$\text{LET } (8S_3 + 4S_2 + 2S_1 + 1S_0 + \overline{1C\pm}) = S_x$$

FOR $\overline{C\pm} = 1$, $S_x = 1, 2, \ldots, 15, 16$

FOR $\overline{C\pm} = 0$, $S_x = 0, 1, \ldots, 14, 15$

Substituting $I_1$ and $I_2$ into $I_{OUT}$ (Equation 6)

$$I_{OUT} = \frac{I_R}{255 \times 32} [(255 \times 16) \overline{C\pm} + 128 (16 C_7' + S_x C_7) + 64(16 C_6' + S_x C_6) + 32(16 C_5' + S_x C_5) + 16(16 C_4' + S_x C_4) + 8(16 C_3' + S_x C_3) + 4(16 C_2' + S_x C_2) + 2(16 C_1' + S_x C_1) + 1(16 C_0' + S_x C_0)].$$

Each code number has a unique code signal word consisting of the control signal bits, and these words may be formed arbitrarily from combinations of zeros and ones and designated for the code numbers in the conventional manner. Following are Tables 3A and 3B showing typical code signal bits required to operate the μ255 law converter in FIG. 4 and provide the number and values which may be found in Orange Book Volume III-2 of The International Telecommunications Union, Geneva, Switzerland.

TABLE 3A
CODE SIGNAL BITS, NUMBER AND VALUES

| C+ | C$_7$' | C$_7$ | C$_6$' | C$_6$ | C$_5$' | C$_5$ | C$_4$' | C$_4$ | C$_3$' | C$_3$ | C$_2$' | C$_2$ | C$_1$' | C$_1$ | C$_0$' | C$_0$ | S$_3$ | S$_2$ | S$_1$ | S$_0$ | Code No. n | Code Value $v_n$ | Code Value $\chi_n$ |
|---|---|---|---|---|---|---|---|---|---|---|---|---|---|---|---|---|---|---|---|---|---|---|---|
| 0 | 0 | 1 | 0 | 0 | 0 | 0 | 0 | 0 | 0 | 0 | 0 | 0 | 0 | 0 | 0 | 0 | 0 | 0 | 0 | 0 | −127 | 128 | −7904 |
| 0 | 0 | 1 | 0 | 0 | 0 | 0 | 0 | 0 | 0 | 0 | 0 | 0 | 0 | 0 | 0 | 0 | 1 | 1 | 1 | 1 | −112 | 2048 | −4064 |
| 0 | 1 | 0 | 0 | 1 | 0 | 0 | 0 | 0 | 0 | 0 | 0 | 0 | 0 | 0 | 0 | 0 | 0 | 0 | 0 | 0 | −111 | 2112 | −3936 |
| 0 | 1 | 0 | 0 | 1 | 0 | 0 | 0 | 0 | 0 | 0 | 0 | 0 | 0 | 0 | 0 | 0 | 1 | 1 | 1 | 1 | −96 | 3072 | −2016 |
| 0 | 1 | 0 | 1 | 0 | 0 | 1 | 0 | 0 | 0 | 0 | 0 | 0 | 0 | 0 | 0 | 0 | 0 | 0 | 0 | 0 | −95 | 3104 | −1952 |
| 0 | 1 | 0 | 1 | 0 | 0 | 1 | 0 | 0 | 0 | 0 | 0 | 0 | 0 | 0 | 0 | 0 | 1 | 1 | 1 | 1 | −80 | 3584 | −992 |
| 0 | 1 | 0 | 1 | 0 | 1 | 0 | 0 | 1 | 0 | 0 | 0 | 0 | 0 | 0 | 0 | 0 | 0 | 0 | 0 | 0 | −79 | 3600 | −960 |
| 0 | 1 | 0 | 1 | 0 | 1 | 0 | 0 | 1 | 0 | 0 | 0 | 0 | 0 | 0 | 0 | 0 | 1 | 1 | 1 | 1 | −64 | 3840 | −480 |
| 0 | 1 | 0 | 1 | 0 | 1 | 0 | 1 | 0 | 0 | 1 | 0 | 0 | 0 | 0 | 0 | 0 | 0 | 0 | 0 | 0 | −63 | 3848 | −464 |
| 0 | 1 | 0 | 1 | 0 | 1 | 0 | 1 | 0 | 0 | 1 | 0 | 0 | 0 | 0 | 0 | 0 | 1 | 1 | 1 | 1 | −48 | 3968 | −224 |
| 0 | 1 | 0 | 1 | 0 | 1 | 0 | 1 | 0 | 1 | 0 | 0 | 1 | 0 | 0 | 0 | 0 | 0 | 0 | 0 | 0 | −47 | 3972 | −216 |
| 0 | 1 | 0 | 1 | 0 | 1 | 0 | 1 | 0 | 1 | 0 | 0 | 1 | 0 | 0 | 0 | 0 | 1 | 1 | 1 | 1 | −32 | 4032 | −96 |
| 0 | 1 | 0 | 1 | 0 | 1 | 0 | 1 | 0 | 1 | 0 | 1 | 0 | 0 | 1 | 0 | 0 | 0 | 0 | 0 | 0 | −31 | 4034 | −92 |
| 0 | 1 | 0 | 1 | 0 | 1 | 0 | 1 | 0 | 1 | 0 | 1 | 0 | 0 | 1 | 0 | 0 | 1 | 1 | 1 | 1 | −16 | 4064 | −32 |
| 0 | 1 | 0 | 1 | 0 | 1 | 0 | 1 | 0 | 1 | 0 | 1 | 0 | 1 | 0 | 0 | 1 | 0 | 0 | 0 | 0 | −15 | 4065 | −30 |
| 0 | 1 | 0 | 1 | 0 | 1 | 0 | 1 | 0 | 1 | 0 | 1 | 0 | 1 | 0 | 0 | 1 | 1 | 1 | 1 | 1 | 0 | 4080 | −0 |

Note:
$\chi_n = 2(v_n - 4080)$

TABLE 3B
CODE SIGNAL BITS, NUMBER, AND VALUES

| C+ | C$_7$' | C$_7$ | C$_6$' | C$_6$ | C$_5$' | C$_5$ | C$_4$' | C$_4$ | C$_3$' | C$_3$ | C$_2$' | C$_2$ | C$_1$' | C$_1$ | C$_0$' | C$_0$ | S$_3$ | S$_2$ | S$_1$ | S$_0$ | Code No. n | Code Value $v_n$ | Code Value $\chi_n$ |
|---|---|---|---|---|---|---|---|---|---|---|---|---|---|---|---|---|---|---|---|---|---|---|---|
| 1 | 0 | 0 | 0 | 0 | 0 | 0 | 0 | 0 | 0 | 0 | 0 | 0 | 0 | 0 | 0 | 0 | 1 | 0 | 0 | 0 | 0 | 4082 | +0 |
| 1 | 0 | 0 | 0 | 0 | 0 | 0 | 0 | 0 | 0 | 0 | 0 | 0 | 0 | 0 | 0 | 0 | 1 | 1 | 1 | 1 | 15 | 4095 | 30 |
| 1 | 0 | 0 | 0 | 0 | 0 | 0 | 0 | 0 | 0 | 0 | 0 | 0 | 1 | 1 | 0 | 0 | 0 | 0 | 0 | 0 | 16 | 4096 | 32 |
| 1 | 0 | 0 | 0 | 0 | 0 | 0 | 0 | 0 | 0 | 0 | 0 | 0 | 1 | 1 | 0 | 1 | 0 | 1 | 1 | 1 | 31 | 4126 | 92 |
| 1 | 0 | 0 | 0 | 0 | 0 | 0 | 0 | 0 | 0 | 0 | 1 | 1 | 0 | 1 | 0 | 0 | 0 | 0 | 0 | 0 | 32 | 4128 | 96 |
| 1 | 0 | 0 | 0 | 0 | 0 | 0 | 0 | 0 | 0 | 0 | 1 | 1 | 0 | 1 | 0 | 1 | 0 | 1 | 1 | 1 | 47 | 4188 | 216 |
| 1 | 0 | 0 | 0 | 0 | 0 | 0 | 0 | 0 | 1 | 1 | 0 | 1 | 0 | 1 | 0 | 0 | 0 | 0 | 0 | 0 | 48 | 4192 | 224 |
| 1 | 0 | 0 | 0 | 0 | 0 | 0 | 0 | 0 | 1 | 1 | 0 | 1 | 0 | 1 | 0 | 1 | 0 | 1 | 1 | 1 | 63 | 4312 | 464 |
| 1 | 0 | 0 | 0 | 0 | 0 | 0 | 1 | 1 | 0 | 1 | 0 | 1 | 0 | 1 | 0 | 0 | 0 | 0 | 0 | 0 | 64 | 4320 | 480 |

TABLE 3B-continued

CODE SIGNAL BITS, NUMBER, AND VALUES

| C+ | C7' | C7 | C6' | C6 | C5' | C5 | C4' | C4 | C3' | C3 | C2' | C2 | C1' | C1 | C0' | C0 | S3 | S2 | S1 | S0 | Code No. n | Code Value $\nu_n$ | Code Value $\chi_n$ |
|---|---|---|---|---|---|---|---|---|---|---|---|---|---|---|---|---|---|---|---|---|---|---|---|
| 1 | 0 | 0 | 0 | 0 | 0 | 0 | 0 | 1 | 1 | 0 | 1 | 0 | 1 | 0 | 1 | 0 | 1 | 1 | 1 | 1 | 79 | 4560 | 960 |
| 1 | 0 | 0 | 0 | 0 | 0 | 1 | 1 | 0 | 1 | 0 | 1 | 0 | 1 | 0 | 1 | 0 | 0 | 0 | 0 | 0 | 80 | 4576 | 992 |
| 1 | 0 | 0 | 0 | 0 | 1 | 1 | 0 | 1 | 0 | 1 | 0 | 1 | 0 | 1 | 0 | 1 | 1 | 1 | 1 | 1 | 95 | 5056 | 1952 |
| 1 | 0 | 0 | 0 | 1 | 1 | 0 | 1 | 0 | 1 | 0 | 1 | 0 | 1 | 0 | 1 | 0 | 0 | 0 | 0 | 0 | 96 | 5088 | 2016 |
| 1 | 0 | 0 | 0 | 1 | 1 | 0 | 1 | 0 | 1 | 0 | 1 | 0 | 1 | 0 | 1 | 0 | 1 | 1 | 1 | 1 | 111 | 6048 | 3936 |
| 1 | 0 | 1 | 1 | 0 | 1 | 0 | 1 | 0 | 1 | 0 | 1 | 0 | 1 | 0 | 1 | 0 | 0 | 0 | 0 | 0 | 112 | 6112 | 4064 |
| 1 | 0 | 1 | 1 | 0 | 1 | 0 | 1 | 0 | 1 | 0 | 1 | 0 | 1 | 0 | 1 | 0 | 1 | 1 | 1 | 1 | 127 | 8032 | 7904 |

Note:
$\chi_n = 2(\nu_n - 4080)$

Figure 6:
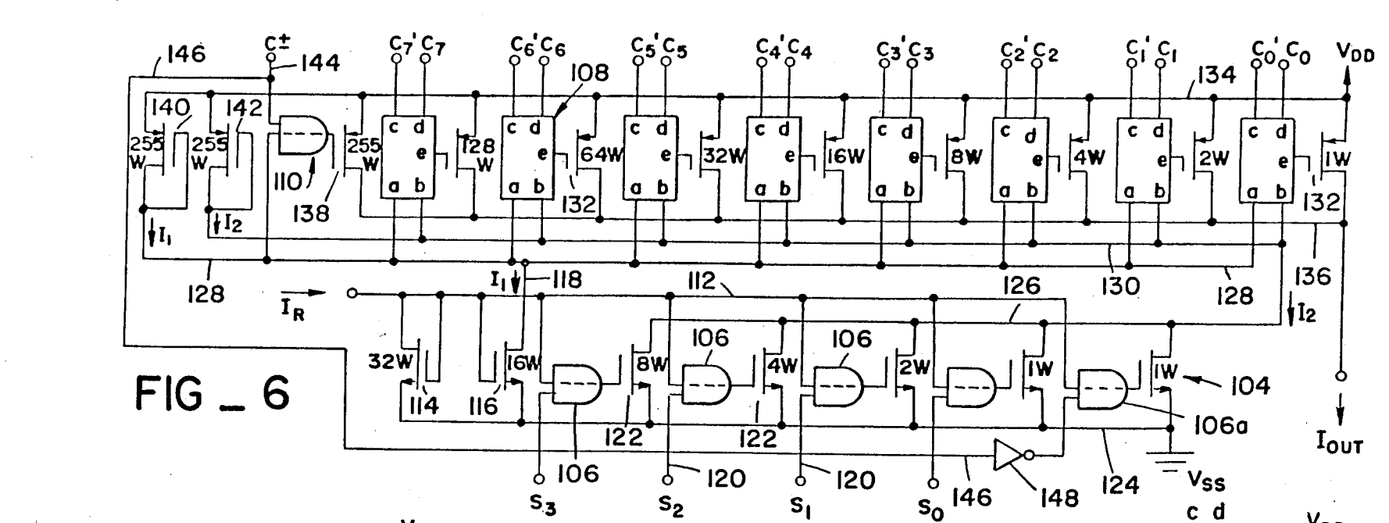
FIG. 6 is a circuit diagram for a companding nonlinear current mirror digital-to-analog converter embodying principles of the present invention.

The circuit representing a digital-to-analog converter 104 for implementing the "$\mu 255$" law according to the present invention is shown in FIG. 6. The circuit is comprised of controlled and uncontrolled current mirrors including a first (or lower) series of N-channel current mirrors 122 for implementing the step values of the law (having values 1,2, ... 16 for the negative quadrant, and values 0,1, ..., 15 for the positive quadrant), and a second (or upper) series of current mirrors 132 for implementing the segment portion of the law (having weighted values 1,2,4, ... 128). A single current mirror 138 is provided for implementing the sign bit to determine the quadrant of operation.

Figure 6A:
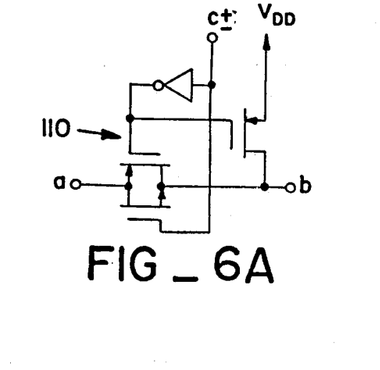
FIG. 6A is a circuit diagram of a P-channel current mirror control gate element used in the converter of FIG. 6.
Figures 6B, 6C:
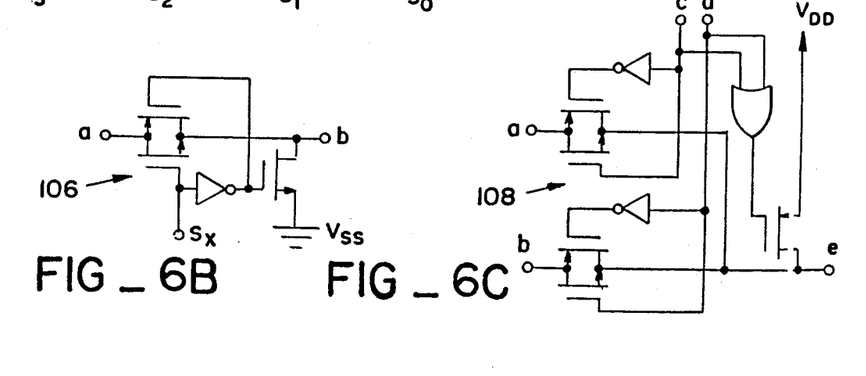
FIG. 6B is a circuit diagram of an N-channel current mirror control gate element used for implementing step portions of the "μ255 law" in the converter of FIG. 6.
FIG. 6C is a circuit diagram of a mirror control gate element for implementing segment portions of the "μ255 law" in the converter of FIG. 6.

A reference current $I_R$ is supplied by a lead 112 to the drain and gate of a first input transistor 114 and also to the gate of a mirroring transistor 116 whose drain is connected by a lead 118 to the upper series of current mirror control gates 108. The $I_R$ current is also furnished as one input to each of the control gates 106. A detailed circuit diagram for these N-channel current mirror control gates is shown in FIG. 6B. The other input leads 120 to these N-channel control gates are connected to separate data inputs $S_0$, $S_1$, $S_2$ and $S_3$. The output of each control gate 106 is connected to the gate of a mirroring MOSFET 122 whose channel has a preselected width (as indicated) so that it will conduct a proportionate amount of current. The source electrodes for all five of these mirroring transistors 122 as well as the transistors 114 and 116 are connected to a common lead 124 from a ground of $V_{SS}$ terminal. The drain electrodes for the mirroring transistors 122 are connected to a common lead 126 extending to the upper series of current mirrors.

The control gates 108 in the upper bank or series, as shown in a detailed circuit diagram of FIG. 6c have two signal input terminals c and d for receiving the coded input data signals (CO CO', Cl Cl', etc.) and two input terminals a and b. The "a" terminals for all eight of the current mirrors are connected in parallel to a common lead 128 and the "b" terminals are connected to a common lead 130. Each of the control gates 108 has an output terminal "e" which is connected to the gate of a mirroring transistor 132 whose source is connected to a common lead 134 from a positive voltage supply $V_{DD}$. The drain electrode of each mirroring transistor is connected to a common lead 136 providing the output current $I_{OUT}$. Each mirroring transistor 132 in the upper series has a channel width that is one-half the size of the next adjacent transistor of the series so as to provide a proportional current output. Thus, as indicated, the eight mirroring transistors connected to the eight control gates 108 have channel widths of 1W to 128W. The P-channel control gate 110 (having the circuitry of FIG. 6A) has an output connected to the gate of a mirroring transistor 138 whose channel width is 255W and whose source is connected to the $V_{DD}$ lead 134. Its drain electrode is connected to the common output lead 136.

A pair of first and second input transistors 140 and 142 are connected in parallel with the mirroring transistors 132 and both have channel widths of 255W. The sources of these transistors are connected to the common $V_{DD}$ lead 134. The drain and gate electrodes of the first transistor 140 are connected to the $I_1$ lead 128 which in turn is connected to the linear "AND" gate 110 and to the "a" inlet terminal of each of the control gates 108, while the drain and gate electrodes of the second transistor 142 are connected to the "b" inlet terminals on these control gates.

The linear AND gate 110 receives a sign data input (C±) through a lead 144 which is also connected via a lead 146 through an inverter 148 to a lower current mirror control gate 106a.

In the operation of the circuit 104 upper current mirrors 132 (having weighted channel values 1, 2, 4, ..., 128) implement the segment portion of the "$\mu 255$" law, and the lower current mirrors 122 implement the step values of the law (having values 1, 2, ..., 16 for the negative quadrant, and values 0, 1, ... 15 for the positive quadrant). To illustrate how those figures and tables are related, an example of one value may be given. Assume that for a selected code number, (e.g. 31) the step bits ($S_3$ to $S_0$) are all ones (1's). Thus, the current $I_2$ consists of the sum of currents from the associated mirrors controlled by those bit values. $I_2$ is thus equal to $(1/32)I_R+(2/32)I_R+(4/32)I_R+(8/32)I_R=(15/32)I_R$, and the current $I_1$ is equal to $(16/32)I_R$. Those currents are directed into the segment portion of the circuit. Since the value selected is within the positive quadrant, the sign bit (C±) is unity (1), and one component of the output current $I_{OUT}$ is thus $(255/255)((16/32)I_R)$. The remaining components are obtained from the lowest weighted segment mirrors 132 (i.e. 1W and 2W) on the upper right of FIG. 6. Those are respectively equal to $(1/255)((16/32)I_R)$ and $(2/255)((15/32)I_R)$. The total sum of currents equals $(1/255 \times 32)(255 \times 16\ I_R+16\ I_R+2\times 15\ I_R)$ or $(1/255\times 32)(4126)I_R$. The value within the parenthesis is the value $\nu_n$ indicated in a predetermined code word table and is normalized according to the value $255\times 32$ equals (8160). To compare to the actual values ($\nu_n$'s) of the $\mu 255$ law, the value $\nu_n$ is adjusted by the equation $2(\nu_n-4080)$. The factor 2 accounts for the simplification made previously and cancels in the normalization procedure. The term 4080 is needed to reposition the origin to the center of the $\mu 255$ graph, and in the actual circuit, this is accomplished by defining the voltage drop created by the current ($I_{OUT}$) in the center of the graph by ground potential.

Thus, it is seen that in a coder-decoder system, a stream of digital data supplied to the digital-to-analog circuit 104 will produce an analog output in accordance with the μ255 law. In this manner, the complexities of the analog voice signal can be reproduced without excessive noise and/or distortion.

Figure 7:
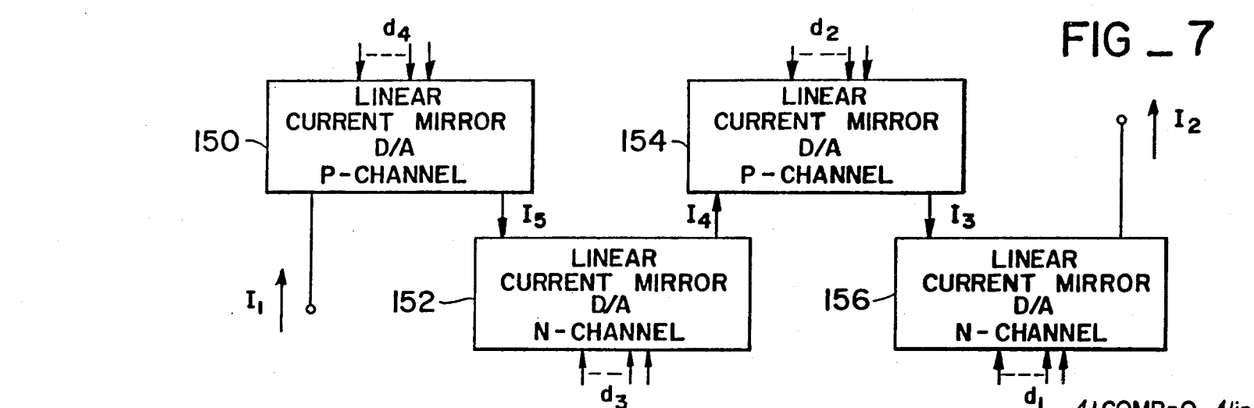
FIG. 7 is a block diagram showing an arrangement for multiplying signals using current mirror digital-to-analog converters according to the present invention.

In digital data transmission, the multiplication of signals is an important signal processing procedure. For example, modulation and conversion of signals from one frequency to another requires such processing. Using the principles of the present invention, multiplication of signals is easily accomplished using four current-mirror digital-to-analog converters 150, 152, 154 and 156 as shown in FIG. 7. These two P-channel and two N-channel current mirror digital-to-analog converters are cascaded by connecting the output of one to the input of another. The input current $I_1$ to the converter 150 may be a reference (constant) current or it may be varying. The current-mirror D to A's may be linear weighted (i.e., the weights of each increasing bit will double compared to the previous bit) or non-linear weighted with the bit weights selected as desired. According to Table 3B, all values of "C" are zero except $C_1$ and $C_0'$ so the current from each D to A converter may be represented by the equation:

$$I_{OUT} = d_i I_{IN} = (w_n C_n + \ldots + w_1 C_1 + w_0 C_0) I_{IN}$$

where
- $I_{OUT}$ $I_{IN}$: The output and input current
- $w_n$: The control bit weight
- $C_n$: The control bit input (having value 0 or 1)
- $d_i$: The general control vector consisting of a sum of products of the control weights and bits The output current $I_2$ is provided by the digital-to-analog converter 156 is $I_2 = d_1 I_3$. The adjacent D to A converter 154 next to it has an output current value of $I_3 = d_2 I_4$; the next adjacent converter 152 has a value of $I_4 = d_3 I_5$, and the last converter 150 has a value of $I_5 = -d_4 I_1$. Substituting those equations results in the output current $I_2$ being a multiplicative function of the digital vectors, i.e., $I_2 = d_4 d_3 d_2 d_1 I_1$. Although FIG. 7 shows a multiplication of four vectors, the size of the multiplication of the digital variables may be of any value (i.e., from two to a value limited by the performance requirements of the multiplying D to A converter).

Current-mirror D to A converters may also be incorporated into an A to D conversion scheme utilizing a conversion technique known as successive approximation. In a typical arrangement shown in FIG. 8, a voltage reference 158 provides a constant voltage $V_R$ to a voltage to current converter consisting of a suitable operational amplifier 160. The output of this op-amp is connected to the gate of an N-channel MOS transistor 162 whose drain is connected to a negative feedback lead 164 that is also connected through a resistor $R_1$ to ground. Thus, a current $V_R/R_1$ is supplied by a lead 166 to a D to A current mirror 168 which receives data inputs from a successive approximation register 170 (SAR). Connected to the current mirror 168 is a current to voltage converter, consisting of a suitable operational amplifier 172 and a resistor $R_2$ (providing an output voltage $v = (1 - d(R_1/R_2)(V_R))$) whose output is connected to a suitable comparator 174 having gain greater than $2^n$ for an n bit converter). The output of the comparator is connected by a lead 176 to the SAR 170, and the positive input to the op-amp 172 is connected by a lead 178 to the reference voltage 158. Thus, the algorithm of the conversion process is as follows with some unknown voltage $v_{in}$ applied to the comparator: the unknown voltage has a value between zero and the reference voltage $V_R$ (say $(11/16)V_R$).

Figure 8:
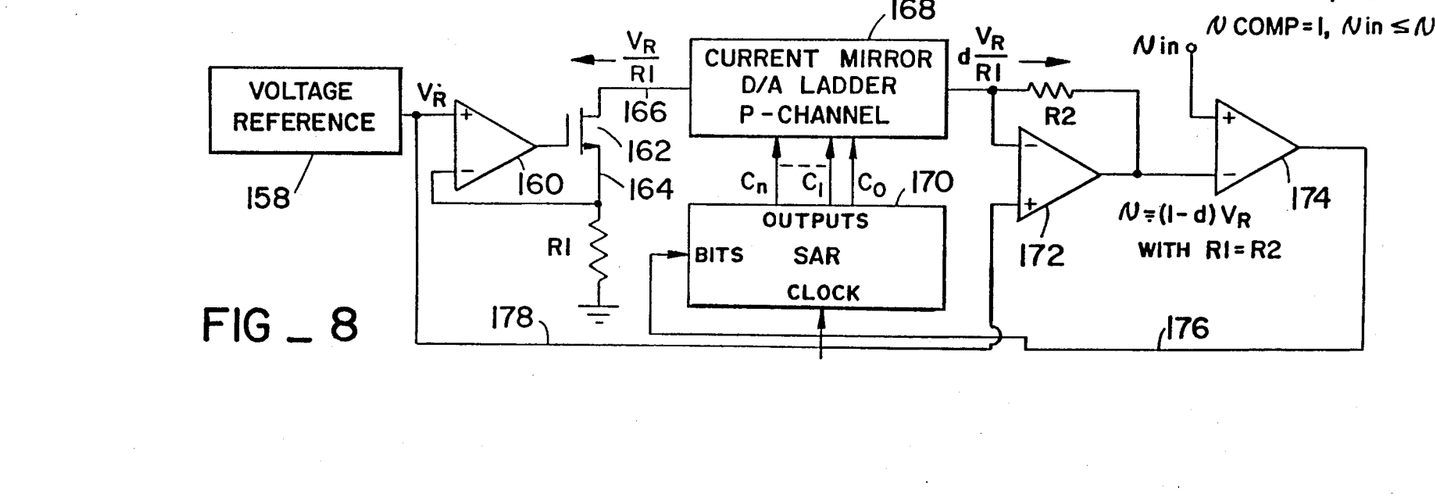
FIG. 8 is a block diagram showing a current mirror digital-to-analog converter in a successive approximation circuit to implement an analog-to-digital converter.

Assume a simple case wherein the converter 168 has a resolution of 4 bits or 16 decision levels. Assume also that all digital bits from the SAR 170 start at value zero at the beginning of the cycle, and that the resistors $R_1$ and $R_2$ have equal values with $v = (1-d)V_R$, and $d = w_n C_n + \ldots + w_1 C_1 + w_0 C_0$ where $w_n$ are the weights and $C_n$ the control (bits), thus $d = 0$.

With the next cycle bit $C_3$ (the most significant bit) is set to a value zero, thus $d = (8/16)$ and the voltage to the comparator's negative input v equals $(1-(8/16)V_R$ or $(7/16)V_R$, since the input value $v_n$ equals $(11/16)V_R$ and the value v is $(7/16)V_R$ (i.e. below $v_{in}$), the comparator provides a digital value zero to the SAR. The SAR will store that value on the signal line $C_3$ for the remaining cycles. For the next cycle, bit $C_2$ is set to value one, thus v equals $(1-(8/16)(0)-(4/16)(1))V_R$ or $(12/16)V_R$. With $v_{in}$ equalling $(11/16)V_R$ and with v equaling $(12/16)V_R$ (i.e. above $v_{in}$), the value provided by the comparator is one and is stored on bit $C_2$. For the next cycle, bit $C_1$ is set to value one, thus v equals $(1-(8/16)(0)-(4/16)(1)-(2/16)(1))V_R$ or $(10/16)V_R$. With $v_{in}$ equaling $(11/16)V_R$ and v equaling $(10/16)V_R$ (i.e. below $v_{in}$)), the value provided by the comparator is zero and is stored on bit $C_1$. For the next cycle, bit $C_0$ is set to value one, thus V equals $(1-(8/16)(0)-(4/16)(1)-(2/16)(0)-(1/16)(1))V_R$ or $(11/16)V_R$. With $v_{in}$ equaling v, the value provided by the comparator is zero and is stored on bit $C_0$. The digital values $C_3 C_2 C_1 C_0 = 0100$ stored in the binary complement of the analog value applied to the A to D (i.e. $v_{stored} = ((8/16)(\bar{0}) + (4/16)(\bar{1}) + (2/16)(\bar{0}) + (1/16)(\bar{0}))V_R = (11/16)V_R$).

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

I claim:

1. A nonlinear current mirror digital to analog converter for providing an analog output signal from binary data signals in accordance with the "μ225" law, said binary data signals including a first set of signals defining a chord and a second set of signals defining a step, said converter comprising:

a first input transistor connected to a current source;

a second transistor, the current flowing through said second transistor being proportional to the current from said current source;

a first set of linear logic gates, each having a first input lead connected to said current source and a second input lead connected to a data source for designating steps of the "μ255" law curve, each gate within said first set of linear logic gates providing an output signal on an output lead;

a first set of transistors, each corresponding to one of said linear logic gates, the current through each transistor within said said first set of transistors being proportional to the current through said first transistor in response to the output signal from said associated linear logic gate;

a second set of transistors;

a second set of linear logic gates, each linear logic gate within said second set having a first digital input lead and a second digital input lead for receiving data signals designating the chords of the "μ255" law curve, each of said logic gates within said second set of logic gates corresponding to a transistor within said second set of transistors, each transistor within said second set of transistors conducting a current proportional to the current from said current source when the signal at the first digital input lead of said corresponding linear logic gate is in a first binary state, each transistor within said second set of transistors conducting a current proportional to the total amount of current through said first set of transistors when the signal present at the second digital input lead of said corresponding logic gate is in said first binary state; and an output lead for conducting an amount of current equal to the total current flowing through said second set of transistors.

2. The nonlinear current mirror digital to analog converter of claim 1 wherein each of said first series of linear logic gates are linear AND gates comprised of one pair of MOSFET devices, said pair of MOSFET devices connecting said first input lead to said output lead in response to said second input lead being in said first binary state, said linear logic gate within said first series of linear logic gates connecting said output lead to a first reference voltage in response to said second input lead being in a second binary state opposite said first binary state; and wherein the linear logic gates within said second set of linear logic gates include a first analog input lead connected to said first set of transistors and a second analog input lead connected to said second transistor, and an output lead, said first analog input lead being connected to said output lead in response to the signal at said first digital input lead being in said first binary state, said second analog input lead being connected to said input lead in response to the signal at said second digital input lead being in said first binary state, said output lead being connected to a second reference voltage in response to the signals at said first and second digital input leads being in said second binary state.

3. The digital to analog converter of claim 1 wherein said first series of linear logic gates includes four linear logic gates for receiving input signals corresponding to a step and a fifth linear logic gate for receiving a digital signal corresponding to a sign bit.

4. A digital to analog converter for providing an analog output signal from binary data signals in accordance with the "μ255" law comprising:

means for providing a first current;

means for receiving a first set of binary data bits indicative of a step value;

a first set of transistors having a first channel conductivity type, each of said transistors being associated with one bit of said first set of binary data bits and conducting a current proportional to said first current in response to said one bit;

means for receiving a second set of binary data bits indicative of a chord value; and a second set of transistors having a second channel conductivity type opposite said first conductivity type, each transistor within said second set being associated with two bits of said second set of binary data bits, each transistor within said second set of transistors conducting a current proportional to said first current in response to a first of said two associated bits, each transistor within said second set of transistors conducting a current proportional to the current through said first set of transistors in response to a second of said two associated bits.

* * * * *

UNITED STATES PATENT AND TRADEMARK OFFICE
CERTIFICATE OF CORRECTION

PATENT NO. : 4,594,577

DATED : June 10, 1986

INVENTOR(S) : Roger A. Mao

It is certified that error appears in the above-identified patent and that said Letters Patent is hereby corrected as shown below:

Col. 9, Table 3A, delete "C+" and insert --C$\pm$--.

Col. 9, Table 3B, delete "C+" and insert --C$\pm$--.

Col. 11, Table 3B-continued, delete "C+" and insert --C$\pm$--.

Col. 13, line 58, delete "$V_R/R_1$" and insert --$(V_R/R_1)$--.

Col. 14, line 38, delete "$V_R=-$" and insert --$V_R=$---.

Col. 14, line 67, delete "said said first" and insert --said first--.

Signed and Sealed this

Twenty-first Day of October, 1986

[SEAL]

Attest:

DONALD J. QUIGG

Attesting Officer

Commissioner of Patents and Trademarks